United States Patent
Chuang et al.

(10) Patent No.: US 9,831,219 B2
(45) Date of Patent: Nov. 28, 2017

(54) MANUFACTURING METHOD OF PACKAGE STRUCTURE

(71) Applicant: Powertech Technology Inc., Hsinchu County (TW)

(72) Inventors: Yong-Cheng Chuang, Hsinchu County (TW); Kuo-Ting Lin, Hsinchu County (TW); Li-Chih Fang, Hsinchu County (TW); Chia-Jen Chou, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/491,982

(22) Filed: Apr. 20, 2017

(65) Prior Publication Data

US 2017/0309597 A1    Oct. 26, 2017

Related U.S. Application Data

(60) Provisional application No. 62/324,899, filed on Apr. 20, 2016.

(51) Int. Cl.
| | |
|---|---|
| *H01L 21/56* | (2006.01) |
| *H01L 25/18* | (2006.01) |
| *H01L 21/78* | (2006.01) |
| *H01L 23/28* | (2006.01) |
| *H01L 25/065* | (2006.01) |

(Continued)

(52) U.S. Cl.
CPC .......... *H01L 25/0657* (2013.01); *H01L 25/50* (2013.01); *H01L 21/563* (2013.01); *H01L 21/568* (2013.01); *H01L 21/78* (2013.01);

*H01L 24/82* (2013.01); *H01L 25/18* (2013.01); *H01L 2224/0237* (2013.01); *H01L 2224/02373* (2013.01); *H01L 2225/0651* (2013.01); *H01L 2225/06517* (2013.01); *H01L 2225/06548* (2013.01); *H01L 2225/06558* (2013.01);

(Continued)

(58) Field of Classification Search
CPC ..... H01L 25/0657; H01L 25/18; H01L 25/50; H01L 21/563; H01L 21/568; H01L 21/78; H01L 24/82; H01L 2224/0237; H01L 2224/02373

See application file for complete search history.

(56) References Cited

U.S. PATENT DOCUMENTS

| | | | | |
|---|---|---|---|---|
| 6,388,333 B1* | 5/2002 | Taniguchi | ......... | H01L 23/49816 257/686 |
| 7,671,457 B1* | 3/2010 | Hiner | .................. | H01L 21/4857 257/678 |

(Continued)

*Primary Examiner* — Mary Wilczewski
(74) *Attorney, Agent, or Firm* — JCIPRNET

(57) ABSTRACT

A manufacturing method of a package structure includes at least the following steps. At least one first die is disposed over a carrier. The first die is encapsulated using a first encapsulant. The first encapsulant exposes part of the first die. A redistribution layer (RDL) is formed over the first encapsulant. The RDL has a first surface and a second surface opposite to the first surface. The first surface faces the first encapsulant. The first encapsulant and the first die are separated from the carrier. A plurality of second dies are disposed on the second surface of the RDL. The second dies are encapsulated using the second encapsulant. A plurality of conductive terminals are formed on the first surface of the RDL.

20 Claims, 10 Drawing Sheets

(51) Int. Cl.
*H01L 25/00* (2006.01)
*H01L 23/00* (2006.01)

(52) U.S. Cl.
CPC ............... *H01L 2225/06572* (2013.01); *H01L 2225/06586* (2013.01)

(56) References Cited

U.S. PATENT DOCUMENTS

| | | | |
|---|---|---|---|
| 7,692,286 B1* | 4/2010 | Huemoeller | H01L 21/6835 257/700 |
| 7,969,018 B2* | 6/2011 | Otremba | H01L 21/561 257/686 |
| 7,993,972 B2* | 8/2011 | Lin | H01L 21/6835 216/14 |
| 8,012,797 B2* | 9/2011 | Shen | H01L 21/4853 438/107 |
| 8,072,059 B2* | 12/2011 | Shim | H01L 21/568 257/698 |
| 8,097,490 B1* | 1/2012 | Pagaila | H01L 21/561 257/E21.007 |
| 8,482,134 B1* | 7/2013 | Darveaux | H01L 24/16 257/686 |
| 8,592,992 B2* | 11/2013 | Lin | H01L 23/49816 257/678 |
| 8,633,598 B1* | 1/2014 | St. Amand | H01L 23/3135 257/778 |
| 8,669,140 B1* | 3/2014 | Muniandy | H01L 21/568 257/774 |
| 8,796,561 B1* | 8/2014 | Scanlan | H01L 24/19 174/260 |
| 8,822,281 B2* | 9/2014 | Pagaila | H01L 21/568 257/686 |
| 8,878,353 B2* | 11/2014 | Haba | H01L 23/528 257/686 |
| 8,883,561 B2* | 11/2014 | Park | H01L 21/4846 257/724 |
| 8,895,440 B2* | 11/2014 | Choi | H01L 21/561 438/113 |
| 8,937,381 B1* | 1/2015 | Dunlap | H01L 23/3128 257/686 |
| 8,952,521 B2* | 2/2015 | Wojnowski | H01L 23/49816 257/675 |
| 8,993,380 B2* | 3/2015 | Hou | H01L 24/97 438/112 |
| 8,994,184 B2* | 3/2015 | Pagaila | H01L 21/486 257/686 |
| 9,013,011 B1* | 4/2015 | Kuo | H01L 27/04 257/415 |
| 9,252,092 B2* | 2/2016 | Lin | H01L 23/49811 |
| 9,269,887 B1* | 2/2016 | Juskey | H01L 25/16 |
| 9,337,073 B2* | 5/2016 | Liu | H01L 23/5389 |
| 9,449,953 B1* | 9/2016 | Shih | H01L 25/0655 |
| 9,564,413 B2* | 2/2017 | Han | H01L 23/3121 |
| 9,607,967 B1* | 3/2017 | Shih | H01L 25/0657 |
| 9,620,465 B1* | 4/2017 | Pan | H01L 24/02 |
| 9,627,365 B1* | 4/2017 | Yu | H01L 23/5227 |
| 9,659,911 B1* | 5/2017 | Chang | H01L 25/0657 |
| 9,679,863 B2* | 6/2017 | Lin | H01L 24/24 |
| 9,704,747 B2* | 7/2017 | Ryu | H01L 23/5389 |
| 9,721,852 B2* | 8/2017 | Graf | H01L 22/10 |
| 9,735,131 B2* | 8/2017 | Su | H01L 25/0657 |
| 9,741,688 B2* | 8/2017 | Yeh | H01L 25/0652 |
| 9,746,889 B2* | 8/2017 | Mittal | G06F 1/206 |
| 9,754,858 B2* | 9/2017 | Pagaila | H01L 23/481 |
| 9,768,155 B2* | 9/2017 | Lin | H01L 21/76877 |
| 2007/0155048 A1* | 7/2007 | Lee | H01L 21/76898 438/106 |
| 2009/0075428 A1* | 3/2009 | Tang | H01L 21/561 438/114 |
| 2010/0052135 A1* | 3/2010 | Shim | H01L 21/568 257/686 |
| 2010/0072599 A1* | 3/2010 | Camacho | H01L 21/6835 257/686 |
| 2010/0127386 A1* | 5/2010 | Meyer-Berg | H01L 21/565 257/698 |
| 2010/0246141 A1* | 9/2010 | Leung | H01L 24/82 361/735 |
| 2010/0289095 A1* | 11/2010 | Poeppel | H01L 23/3128 257/414 |
| 2011/0018119 A1* | 1/2011 | Kim | H01L 23/3128 257/690 |
| 2011/0068459 A1* | 3/2011 | Pagaila | H01L 21/568 257/698 |
| 2011/0129960 A1* | 6/2011 | Park | H01L 21/563 438/107 |
| 2011/0233754 A1* | 9/2011 | Meyer-Berg | H01L 21/56 257/693 |
| 2011/0278707 A1* | 11/2011 | Chi | H01L 21/4832 257/676 |
| 2011/0278736 A1* | 11/2011 | Lin | H01L 25/50 257/774 |
| 2011/0298101 A1* | 12/2011 | Pagaila | H01L 21/561 257/659 |
| 2011/0304015 A1* | 12/2011 | Kim | H01L 23/552 257/532 |
| 2011/0316156 A1* | 12/2011 | Pagaila | H01L 21/561 257/738 |
| 2012/0032340 A1* | 2/2012 | Choi | H01L 21/561 257/774 |
| 2012/0038034 A1* | 2/2012 | Shin | H01L 25/16 257/676 |
| 2012/0049334 A1* | 3/2012 | Pagaila | H01L 21/568 257/666 |
| 2012/0056312 A1* | 3/2012 | Pagaila | H01L 21/561 257/684 |
| 2012/0061825 A1* | 3/2012 | Chang | H01L 21/561 257/737 |
| 2012/0104624 A1* | 5/2012 | Choi | H01L 25/16 257/774 |
| 2012/0217629 A1* | 8/2012 | Cho | H01L 25/16 257/692 |
| 2012/0273960 A1* | 11/2012 | Park | H01L 21/4846 257/774 |
| 2012/0299191 A1* | 11/2012 | Camacho | H01L 21/561 257/774 |
| 2012/0319284 A1* | 12/2012 | Ko | H01L 24/92 257/773 |
| 2013/0037929 A1* | 2/2013 | Essig | H01L 23/49816 257/693 |
| 2013/0049205 A1* | 2/2013 | Meyer | H01L 23/3107 257/773 |
| 2013/0069222 A1* | 3/2013 | Camacho | H01L 23/49827 257/737 |
| 2013/0069224 A1* | 3/2013 | Kim | H01L 23/49827 257/737 |
| 2013/0069239 A1* | 3/2013 | Kim | H01L 23/49827 257/774 |
| 2013/0069252 A1* | 3/2013 | Han | H01L 23/3121 257/787 |
| 2013/0075936 A1* | 3/2013 | Lin | H01L 24/19 257/777 |
| 2013/0105989 A1* | 5/2013 | Pagaila | H01L 21/56 257/774 |
| 2013/0154108 A1* | 6/2013 | Lin | H01L 23/49816 257/774 |
| 2013/0241077 A1* | 9/2013 | Fuergut | H01L 23/492 257/774 |
| 2013/0241080 A1* | 9/2013 | Pagaila | H01L 21/486 257/774 |
| 2013/0341784 A1* | 12/2013 | Lin | H01L 21/56 257/737 |
| 2014/0027929 A1* | 1/2014 | Lin | H01L 23/49816 257/774 |
| 2014/0048906 A1* | 2/2014 | Shim | H01L 23/481 257/531 |
| 2014/0091471 A1* | 4/2014 | Chen | H01L 24/19 257/770 |
| 2014/0239438 A1* | 8/2014 | Kilger | H01L 21/82 257/528 |

(56) References Cited

U.S. PATENT DOCUMENTS

| | | | |
|---|---|---|---|
| 2014/0312481 A1* | 10/2014 | Choi | H01L 25/50 257/686 |
| 2014/0367848 A1* | 12/2014 | Chi | H01L 24/24 257/737 |
| 2015/0001708 A1* | 1/2015 | Lin | H01L 23/49811 257/737 |
| 2015/0041979 A1* | 2/2015 | Goudarzi | H01L 23/49811 257/738 |
| 2015/0041987 A1* | 2/2015 | Yew | H01L 23/481 257/774 |
| 2015/0262968 A1 | 9/2015 | Aleksov et al. | |
| 2015/0270247 A1* | 9/2015 | Chen | H01L 24/19 257/738 |
| 2015/0282367 A1* | 10/2015 | Barth | H01L 25/0657 361/729 |
| 2015/0294962 A1* | 10/2015 | Lin | H01L 25/50 438/108 |
| 2015/0382463 A1* | 12/2015 | Kim | H01L 23/49822 361/767 |
| 2016/0020193 A1* | 1/2016 | Lee | H01L 28/40 257/774 |
| 2016/0118332 A1* | 4/2016 | Lin | H01L 22/20 257/773 |
| 2016/0148820 A1* | 5/2016 | Lee | H01L 25/50 438/127 |
| 2016/0163564 A1* | 6/2016 | Yu | H01L 24/83 257/774 |
| 2016/0233196 A1* | 8/2016 | Kim | H01L 25/0657 |
| 2016/0334845 A1* | 11/2016 | Mittal | H01L 23/34 |
| 2017/0005044 A1* | 1/2017 | Ishido | H01L 23/562 |
| 2017/0033026 A1* | 2/2017 | Ho | H01L 21/56 |
| 2017/0033062 A1* | 2/2017 | Liu | H01L 23/66 |
| 2017/0033080 A1* | 2/2017 | Chen | H01L 25/0657 |
| 2017/0069532 A1* | 3/2017 | Lee | H01L 24/19 |
| 2017/0133351 A1* | 5/2017 | Su | H01L 25/50 |
| 2017/0186711 A1* | 6/2017 | Fang | H01L 24/02 |
| 2017/0194290 A1* | 7/2017 | Yu | H01L 25/0652 |
| 2017/0221858 A1* | 8/2017 | Yu | H01L 24/83 |
| 2017/0221863 A1* | 8/2017 | Yeh | H01L 25/0657 |
| 2017/0236788 A1* | 8/2017 | Lin | H01L 23/562 257/668 |
| 2017/0250170 A1* | 8/2017 | Yu | H01L 25/18 |

* cited by examiner

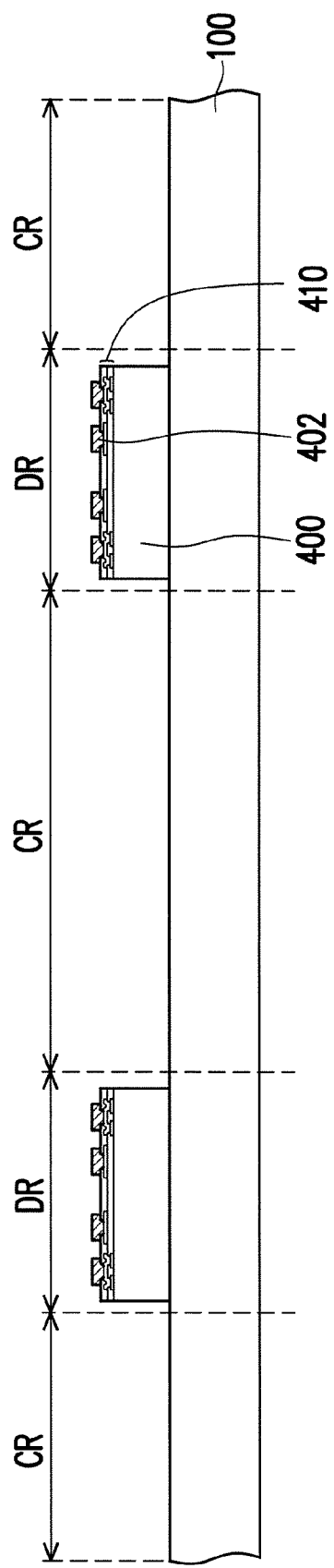

US 9,831,219 B2

MANUFACTURING METHOD OF PACKAGE STRUCTURE

CROSS REFERENCE TO RELATED APPLICATION

This application claims the priority benefit of U.S. provisional application Ser. No. 62/324,899, filed on Apr. 20, 2016. The entirety of the above-mentioned patent application is hereby incorporated by reference herein and made a part of specification.

BACKGROUND OF THE INVENTION

1. Field of the Invention

The present invention generally relates to a manufacturing method of a package structure, and more particularly, to a manufacturing method of a package structure having dies on both sides of a redistribution layer (RDL).

2. Description of Related Art

In order for electronic product design to achieve being light, slim, short, and small, semiconductor packaging technology has kept progressing, in attempt to develop products that are smaller in volume, lighter in weight, higher in integration, and more competitive in market. For example, in order to achieve a thinner electronic product, it is favorable to provide a high density packaging structure with a smaller thickness. As such, miniaturizing the package structure while maintaining the number of chips encapsulated in the package has become a challenge to researchers in the field.

SUMMARY OF THE INVENTION

The invention provides a manufacturing method of a package structure, which effectively reduces the size and the manufacturing cost thereof.

The invention provides a manufacturing method of a package structure. The method includes at least the following steps. At least one first die is disposed over a carrier. The first die is encapsulated using a first encapsulant. The first encapsulant exposes part of the first die. A redistribution layer (RDL) is formed over the first encapsulant. The RDL has a first surface and a second surface opposite to the first surface. The first surface faces the first encapsulant. The first encapsulant and the first die are separated from the carrier. A plurality of second dies are disposed on the second surface of the RDL. The second dies are encapsulated using the second encapsulant. A plurality of conductive terminals are formed on the first surface of the RDL.

Based on the above, the dies are formed on both sides of the RDL in the package structure of the invention. Therefore, a substrate having a large thickness may be eliminated in the package structure of the invention. In addition, since at least one die is located on a surface opposite to the rest of the dies in a flip-chip manner, the at least one die may be grinded to any thickness. As a result, a thickness of the package structure may be reduced, thereby achieving miniaturization in the package structure. Furthermore, the simplicity of the manufacturing process of the package structure may be realized, thereby reducing the overall manufacturing cost.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1J are schematic cross-sectional views illustrating a manufacturing method of a package structure according to an embodiment of the invention.

DESCRIPTION OF THE EMBODIMENTS

Figure 1B:
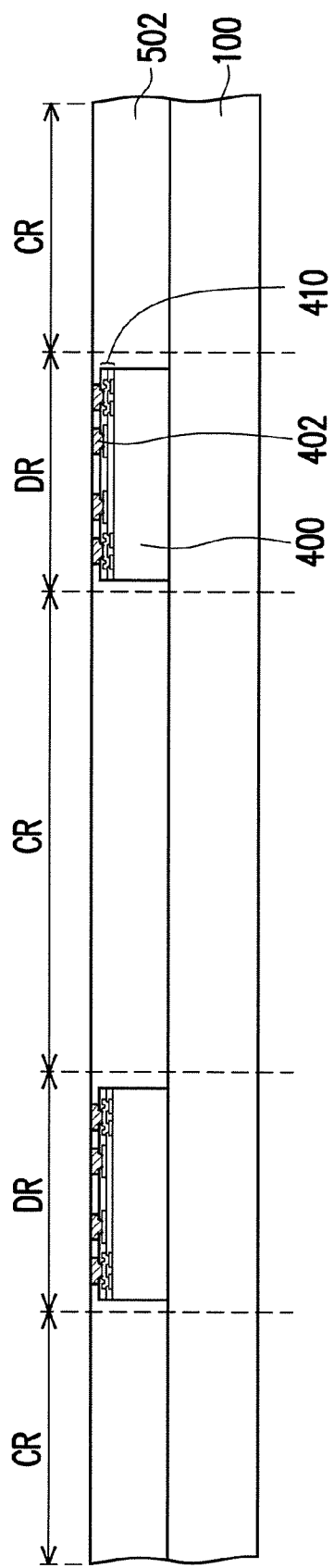

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1J are schematic cross-sectional views illustrating a manufacturing method of a package structure 10 according to an embodiment of the invention. Referring to FIG. 1A, a plurality of first dies 400 are disposed over a carrier 100. The carrier 100 is, for example, a glass substrate or a glass supporting board. However, they construe no limitation in the invention. Other suitable substrate material may be adapted as the carrier 100 as long the material is able to withstand the subsequent processes while carrying the package structure formed thereon. In some embodiments, the carrier 100 is divided into a plurality of die attach regions DR and a plurality of contact regions CR, and the contact regions CR surround the die attach regions DR.

The first dies 400 are disposed in the die attach regions DR. The first dies 400 are, for example, an ASIC (Application-Specific Integrated Circuit). However, it construes no limitation in the invention. Other suitable active devices may also be utilized as the first dies 400. Moreover, it should be noted that only one first die 400 is shown in each of the die attach region DR in FIG. 1A, but the number of the first dies 400 located within each of the die attach region DR is not limited thereto. In other embodiments, multiple first dies 400 may be stacked on top of each other in each of the die attach region DR. In some embodiments, a die attach film (DAF; not illustrated) may be disposed between the first dies 400 and the carrier 100 to temporarily enhance the adhesion between the two. However, in order to enhance the releasability of the first dies 400 from the carrier 100 in the subsequent process, a de-bonding layer (not illustrated) may be disposed between the first dies 400 and the carrier 100 in some alternative embodiments. The de-bonding layer is, for example, a LTHC (light to heat conversion) release layer or other suitable release layers.

Each of the first dies 400 includes a redistribution circuit layer 410 and a plurality of conductive bumps 402 over the redistribution circuit layer 410. The redistribution circuit layer 410 may be constituted by a plurality of pads, a plurality of passivation patterns, and a plurality of interconnection structures. In some embodiments, the first dies 400 may be manufactured by the following steps. First, a wafer (not illustrated) having the pads formed thereon is provided. Subsequently, a passivation layer is formed to cover the pads and the wafer. The passivation layer is patterned to render the passivation patterns. The passivation layer may be patterned through a photolithography and an etching process, for example. The passivation patterns exposes at least part of the pads. Thereafter, the interconnection structures are formed over the pads and the passivation patterns. The foregoing steps may be repeated several times to render a multi-layered redistribution circuit layer 410. Then, the conductive bumps 402 are formed over the topmost interconnection structure. The conductive bumps 402 may be formed through a plating process. The plating process is, for example, electro-plating, electroless-plating, immersion plating, or the like. Afterward, the wafer is diced to obtain a plurality of first dies 400. It should be noted that a surface of each first die 400 having the conductive bumps 402 formed thereon is considered as an active surface of the first die 400. In some embodiments, the conductive bumps 402 may include copper, tin, gold, nickel, or solder. For example, the conductive bumps 402 may include copper pillars, so solder paste such as tin or silver may be eliminated when the conductive bumps 402 are coupled to other elements subsequently formed thereon.

Referring to FIG. 1B, a first encapsulant 502 is disposed over the first dies 400 and the carrier 100 to encapsulate the first dies 400. For example, the first encapsulate 502 may be disposed over the first dies 400 and the carrier 100 such that the first dies 400 are completely encapsulated by the first encapsulate 502. In some embodiments, the first encapsulate 502 may be a molding compound formed by molding processes. However, in some alternative embodiments, the first encapsulate 502 may be formed by an insulating material such as epoxy or other suitable resins. Subsequently, a thickness of the first encapsulate 502 is reduced until part of each first dies 400 is exposed. In some embodiments, the thickness of the first encapsulate 502 is reduced until a top surface of the conductive bumps 402 is exposed. In some embodiments, the thickness of the first encapsulate 502 may be reduced through grinding. For example, a chemical mechanical polishing (CMP) technique may be adapted to reduce the thickness of the first encapsulate 502, so a top surface of the first encapsulant 502 is coplanar with the top surface of the conductive bumps 402. In some embodiments, the conductive bumps 402 are further partially removed through an etching process such that the top surface of the conductive bumps 402 is slightly lower than the top surface of the first encapsulant 502. For example, the top surface of the conductive bumps 402 is 1 μm to 3 μm lower than the top surface of the first encapsulant 502. As a result, a surface roughness of the first encapsulant 502 and the conductive bumps 402 may be enhanced, so as to increase an adhesive property with layers subsequently formed thereon.

Figure 1C:
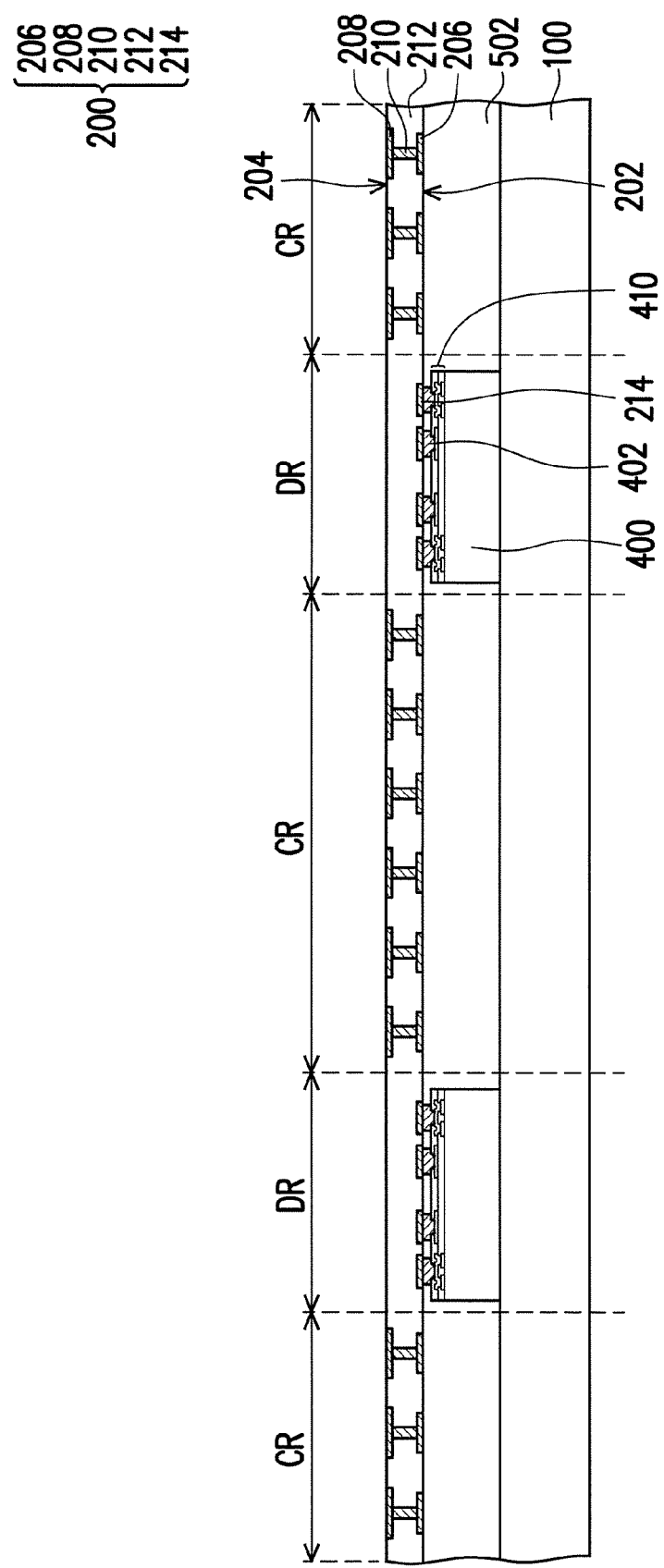

Referring to FIG. 1C, a redistribution layer (RDL) 200 is formed over the first encapsulant 502 and the first dies 400. The RDL 200 has a first surface 202 and a second surface 204 opposite to the first surface 202. The first surface 202 faces the first encapsulant 502. In some embodiments, the first surface 202 is in direct contact with the first encapsulant 502. The RDL 200 includes a first metallic layer 206, a second metallic layer 208, a third metallic layer 214, a plurality of via plug structures 210, and a dielectric layer 212. The first metallic layer 206, the second metallic layer 208, the third metallic layer 214, and the via plug structures 210 are embedded in the dielectric layer 212. However, the dielectric layer 212 exposes at least part of the first metallic layer 206, the second metallic layer 208, and the third metallic layer 214 for electrical connection purposes. In some embodiments, the first metallic layer 206 and the third metallic layer 214 are the same metallization layer formed through the same process. Moreover, the first metallic layer 206 and the second metallic layer 208 are located in the contact regions CR while the third metallic layer 214 is located in the die attach regions DR. The first metallic layer 206, the second metallic layer 208, and the third metallic layer 214 are electrically coupled to each other through the via plug structures 210.

As illustrated in FIG. 1C, the conductive bumps 402 of the first dies 400 are attached to the third metallic layer 214 in a flip-chip manner to electrically connect with the RDL 200. In other words, the active surface of each of the first dies 400 is bonded to the third metallic layer 214 of RDL 200 through the conductive bumps 402.

It should be noted that some metallic layers in the RDL 200 are omitted in the illustration presented in FIG. 1C for simplicity. However, in some alternative embodiments, other than the first metallic layer 206, the second metallic layer 208, and the third metallic layer 214, the RDL 200 may also include additional metallic layers embedded in the dielectric layer 212 based on the circuit design. The RDL 200 has a thickness ranges from 10 μm to 100 μm. Since the RDL 200 is thinner compared to the conventionally known substrate, the RDL 200 in the invention is different from a substrate.

Figure 1D:
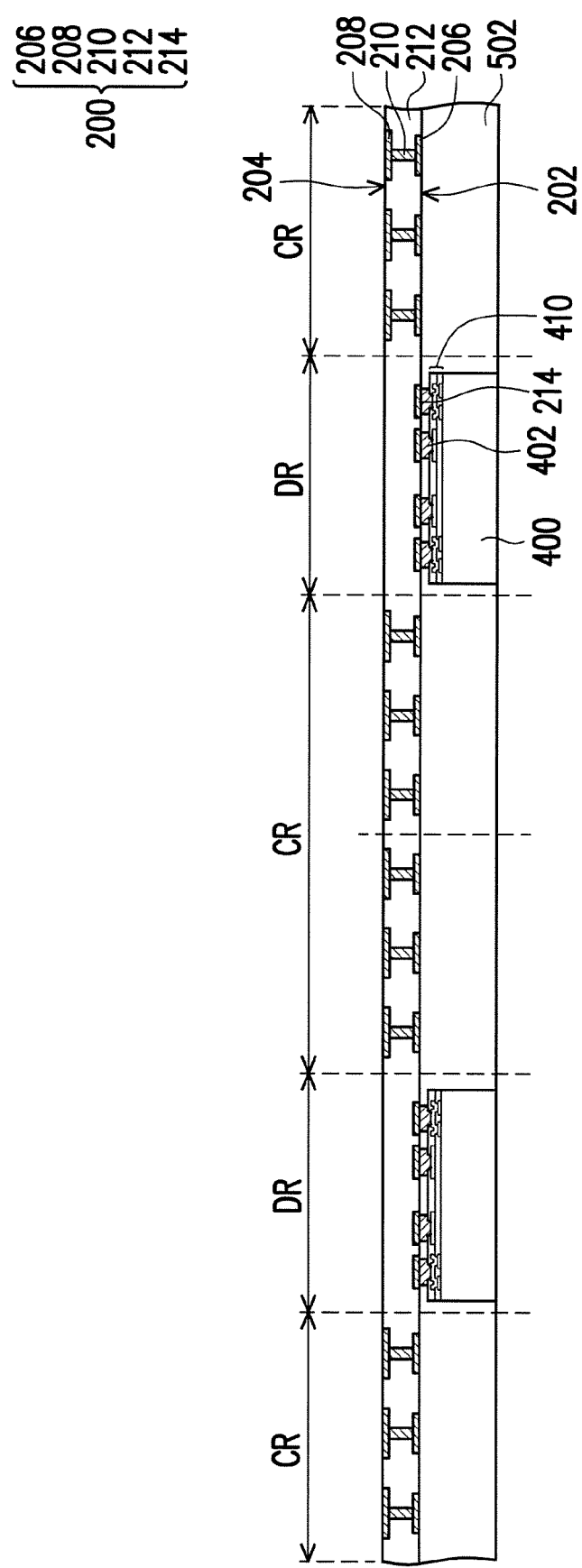
Figure 1E:
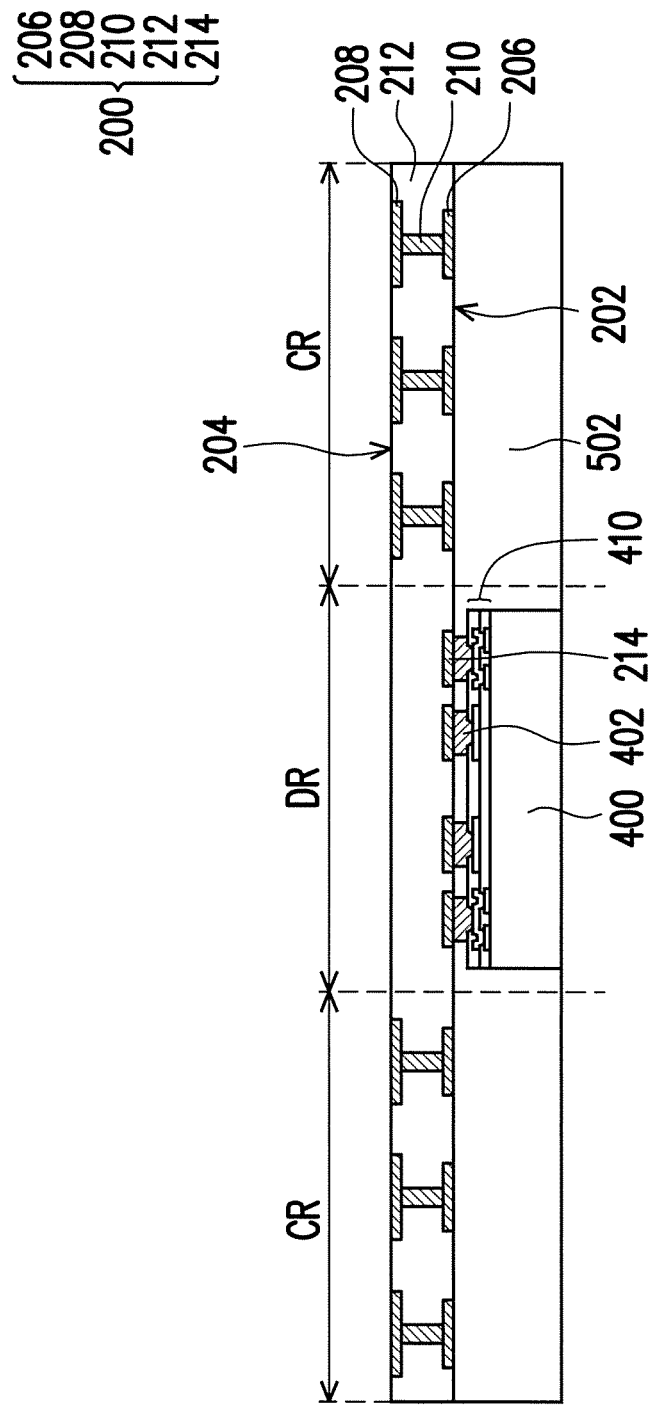

Referring to FIG. 1D, the first encapsulant 502 and the first dies 400 having the RDL 200 formed thereon are separated from the carrier 100. For example, the first encapsulant 502 and the first dies 400 may be separated from the carrier 100 through chemical etching. Alternatively, as mentioned above, the de-bonding layer (not illustrated) may be disposed between the first encapsulant 502/the first dies 400 and the carrier 100. Therefore, external energy (for example, UV laser, visible light, or heat) may be applied to the de-bonding layer, so as to allow the first encapsulant 502 and the first dies 400 to peel off from the carrier 100. Thereafter, a dicing or singulation process is performed on the package structure array illustrated in FIG. 1D to render a plurality of intermediate package structures illustrated in FIG. 1E. The singulation process includes, for example, cutting with rotating blade or laser beam.

Figure 1F:
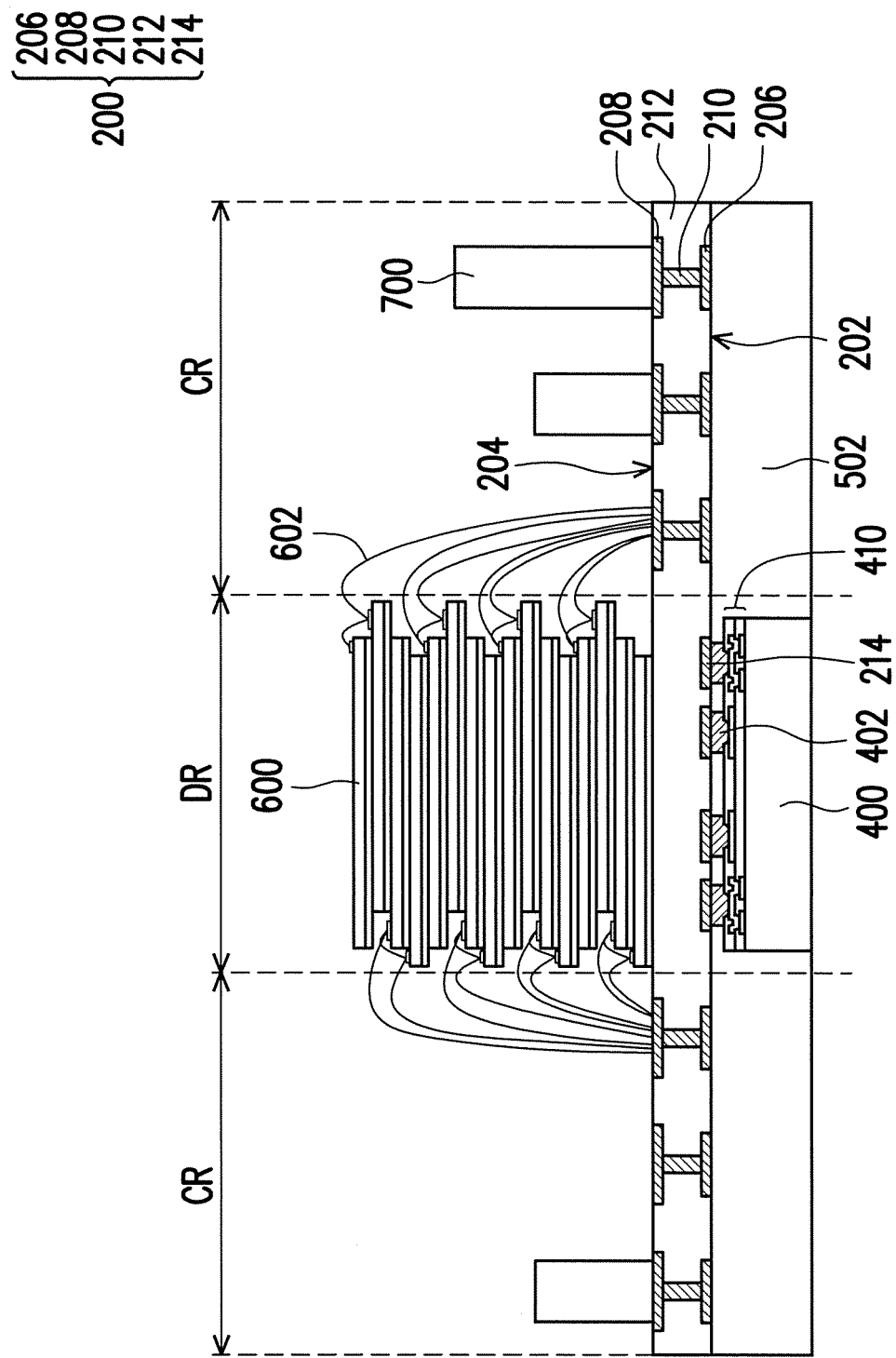

Referring to FIG. 1F, a plurality of second dies 600 and a plurality of passive components 700 are disposed over the second surface 204 of the RDL 200. The second dies 600 are disposed in the die attach regions DR while the passive components 700 are disposed in the contact regions CR. In other words, the passive components 700 are disposed on the periphery of the second dies 600. The second dies 600 are, for example, memory devices such as NAND flash die. However, it construes no limitation in the invention. Other suitable chips may also be utilized as the second dies 600. A die attach film (not illustrated) may be formed between the second dies 600 and the RDL 200 to enhance the adhesion between the second dies 600 and the RDL 200. The second dies 600 are electrically connected to the second metallic layer 208 of the RDL 200 through wires 602. In other words, the second dies 600 are electrically to the RDL 200 through wire bonding. As illustrated in FIG. 1F, multiple second dies 600 are stacked on top of each other. The passive components 700 are disposed on the second metallic layer 208 in the contact regions CR. Examples of the passive components 700 include capacitors, resistors, inductors, fuses, or antennas.

Figure 1G:
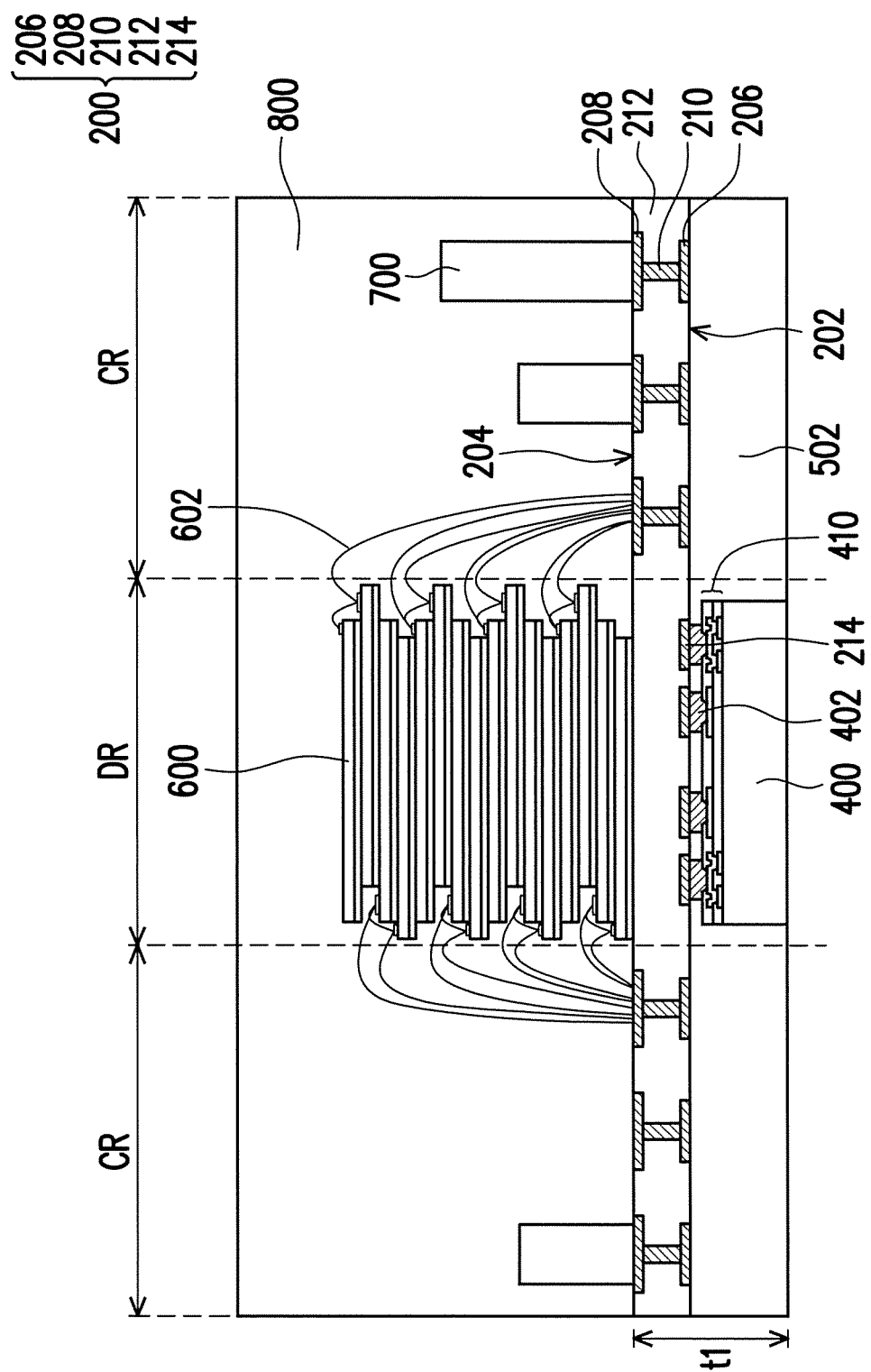
Figure 1H:
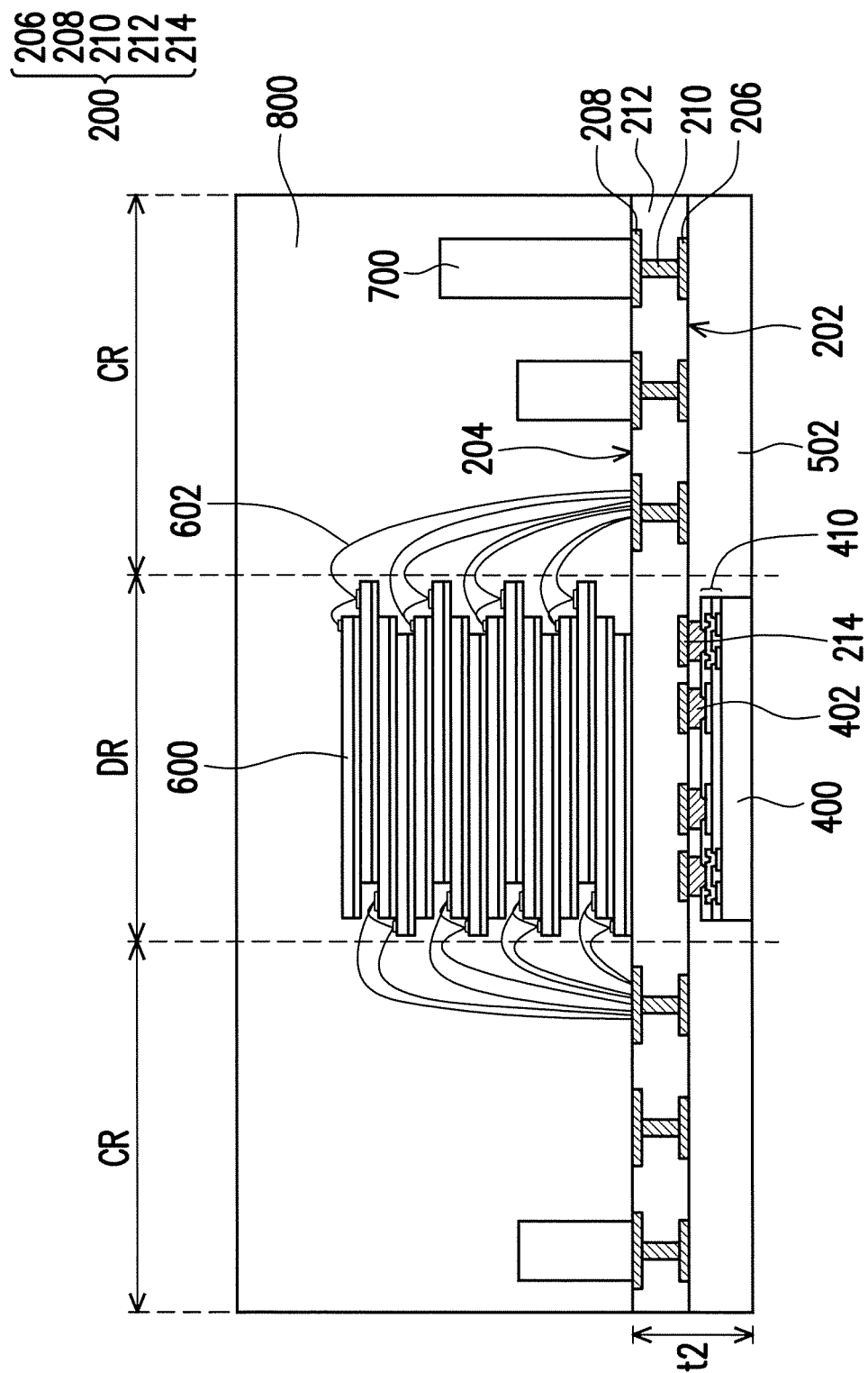
Figure 11:
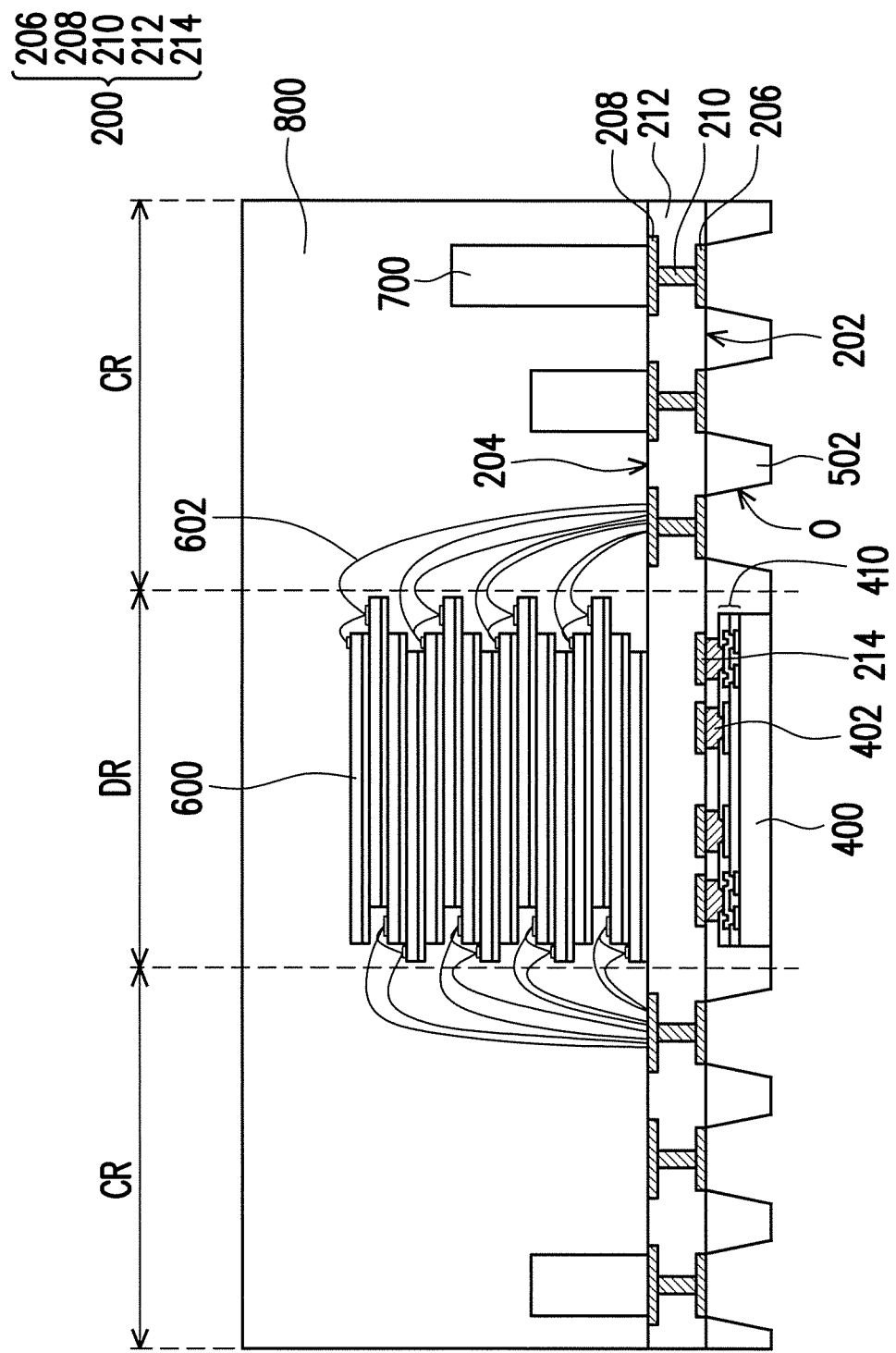

Referring to FIG. 1G, a second encapsulant 800 is disposed over the RDL 200 to encapsulate the second dies 600 and the passive components 700. Similar to the first encapsulant 502, the second encapsulant 800 is also formed by a molding compound or an insulating material. In some embodiments, a total thickness t1 of the RDL 200 and the first encapsulant 502 is greater and equal to 250 μm. Referring to FIG. 1H, the total thickness t1 of the RDL 200 and the first encapsulant 502 is reduced. For example, the thicknesses of the first dies 400 and the first encapsulant 502 may be reduced through mechanical grinding, chemical mechanical polishing (CMP), etching, or other suitable processes. Since the portion removed is located on a surface opposite to the active surface of the first dies 400, the foregoing process may be referred to as backside grinding. In other words, the first dies 400 may be grinded to desired thicknesses without affecting the electrical properties thereof. In some embodiments, the reduced thickness t2 of the RDL 200 and the first encapsulant 502 is 50 μm to 250 μm. As such, the grinding process is able to aid the thickness reduction in the package structure as a whole, thereby achieving package miniaturization.

Referring to FIG. 1I, a plurality of openings O are formed in the first encapsulant 502. The openings O are formed to expose the first surface 202 of the RDL 200. For example, as illustrated in FIG. 1I, the openings O are formed corresponding to the first metallic layer 206. The openings O may be formed through a drilling process. For example, a laser drilling or a mechanical drilling process may be performed on the first encapsulant 502 to generate the openings O. Since the openings O correspond to the first metallic layer 206, the openings O are located in the contact regions CR.

Figure 1J:
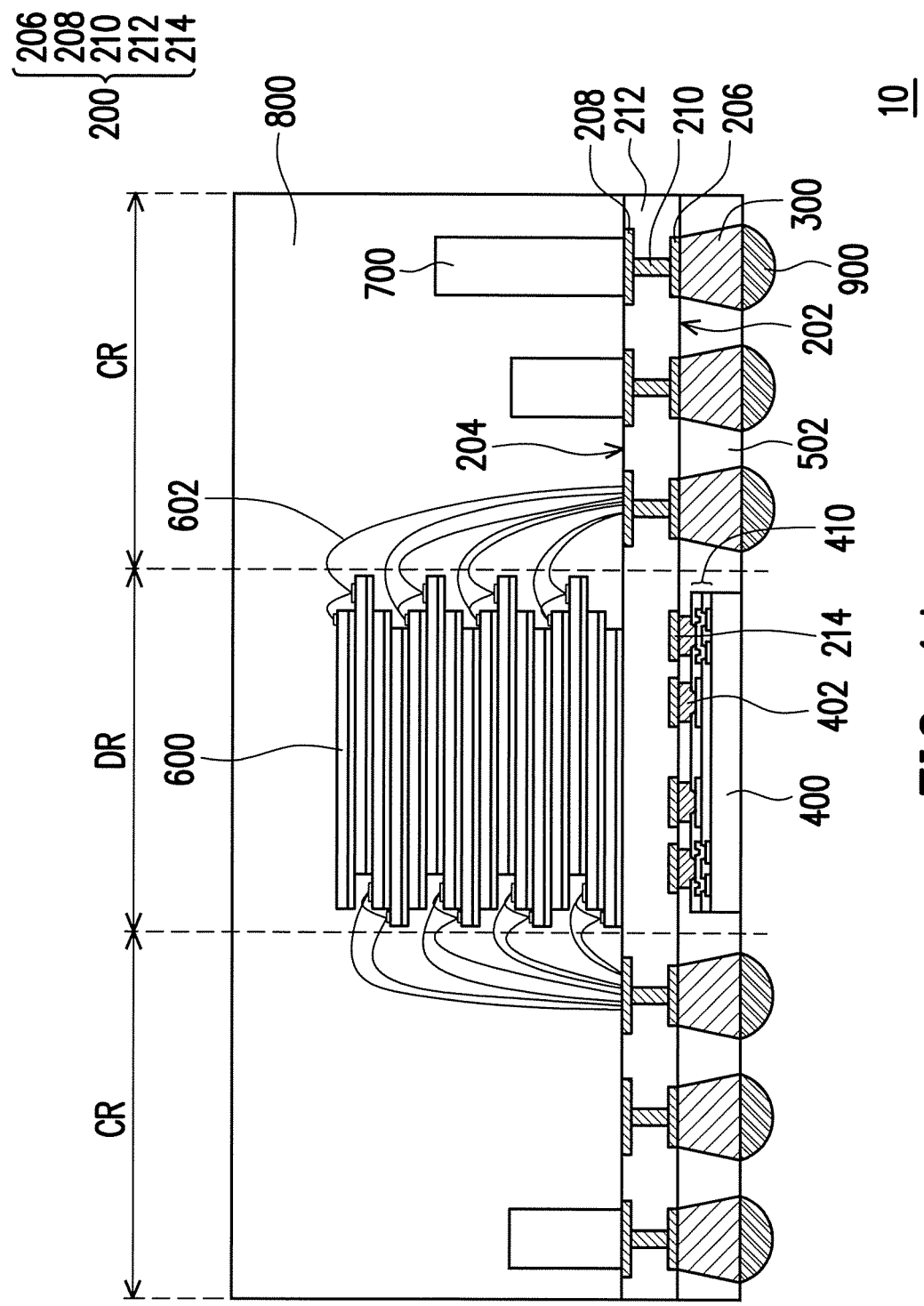

Referring to FIG. 1J, a conductive material is filled into the openings O to form the conductive terminals 300 on the first surface 202 of the RDL 200. The conductive terminals 300 are formed around the periphery of the first dies 400. Since the conductive terminals 300 are formed by filling the conductive material into the openings O, the conductive terminals 300 may be referred to as through molding vias (TMV). The conductive terminals 300 are electrically connected to the first metallic layer 206 of the RDL 200. In some embodiments, a surface of the conductive terminals 300 is substantially coplanar to a surface of the first encapsulant 502. In other words, the first encapsulant 502 exposes the conductive terminals 300. Furthermore, in some embodiments, solder balls 900 are formed over the conductive terminals 300 to enhance electrical connection with other package structures. For example, the solder balls 900 may protrude from the surface (the surface exposing the conductive terminals 300) of the first encapsulant 502. The solder balls 900 are formed over the conductive terminals 300 exposed by the first encapsulant 502 through a ball placement process. As illustrated in FIG. 1J, the second dies 600 and the passive components 700 are electrically connected to the conductive terminals 300 through the wires 602, the second metallic layer 208, the via plug structures 210, and the first metallic layer 206.

Referring FIG. 1J, the first die 400 and the second dies 600 are respectively formed on the first surface 202 and the second surface 204 of the RDL 200. Therefore, a substrate having a large thickness may be eliminated in the package structure 10. In addition, since the first die 400 is disposed in a flip-chip manner, the first die 400 may be grinded to any desired thickness. Moreover, as illustrated in FIG. 1J, the first die 400 is coplanar with the conductive terminals 300. As such, a thickness of the package structure 10 may be effectively reduced, so as to achieve miniaturization in the package structure 10. Furthermore, as illustrated in FIG. 1A to FIG. 1J, since the simplicity of the manufacturing process of the package structure 10 may be realized, the overall manufacturing cost may be reduced.

Based on the above, the dies are formed on both sides of the RDL in the package structure of the invention. Therefore, a substrate having a large thickness may be eliminated in the package structure of the invention. In addition, since at least one die is located on a surface opposite to the rest of the dies in a flip-chip manner, the at least one die may be grinded to any thickness. As a result, a thickness of the package structure may be reduced, thereby achieving miniaturization in the package structure. Furthermore, the simplicity of the manufacturing process of the package structure may be realized, thereby reducing the overall manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
    disposing at least one first die over a carrier;
    encapsulating the first die using a first encapsulant, wherein the first encapsulant exposes part of the first die;
    forming a redistribution layer (RDL) over the first encapsulant, wherein the RDL has a first surface and a second surface opposite to the first surface, and the first surface faces the first encapsulant;
    separating the first encapsulant and the first die from the carrier;
    disposing a plurality of second dies on the second surface of the RDL;
    encapsulating the second dies using a second encapsulant; and
    forming a plurality of conductive terminals on the first surface of the RDL.

2. The method according to claim 1, further comprising:
    forming a plurality of passive components on the second surface of the RDL.

3. The method according to claim 2, further comprising:
    encapsulating the passive components using the second encapsulant.

4. The method according to claim 2, wherein the passive components comprises capacitors, resistors, inductors, fuses, or antennas.

5. The method according to claim 1, wherein the step of encapsulating the first die precedes the step of forming the conductive terminals.

6. The method according to claim 1, wherein the step of forming the conductive terminals on the first surface of the RDL comprises:
    forming a plurality of openings in the first encapsulant to expose the first surface of the RDL; and
    filling a conductive material into the openings to form the conductive terminals.

7. The method according to claim 6, wherein the openings are formed by a laser drilling process or a mechanical drilling process.

8. The method according to claim 1, wherein the conductive terminals comprise through molding vias (TMV).

9. The method according to claim 1, wherein the step of encapsulating the first die comprises:
    disposing a first encapsulant over the first die; and
    reducing a thickness of the first encapsulant to expose part of the first die.

10. The method according to claim 1, after the step of separating the first encapsulant and the first die from the carrier, further comprising:
reducing a thickness of the first encapsulant and the first die.

11. The method according to claim 10, wherein a reduced thickness of the first encapsulant and the RDL is 50 µm to 250 µm.

12. The method according to claim 1, further comprising:
forming a plurality of solder balls over the conductive terminals, wherein a surface of the conductive terminals is substantially coplanar to a surface of the first encapsulant, and the solder balls protrude from the surface of the first encapsulant.

13. The method according to claim 12, wherein the solder balls are formed through a ball placement process.

14. The method according to claim 1, wherein the first die comprises a redistribution circuit layer and a plurality of conductive bumps over the redistribution circuit layer.

15. The method according to claim 14, wherein the conductive bumps comprise copper, tin, gold, nickel, or solder.

16. The method according to claim 1, wherein the second dies are formed to stack on top of each other.

17. The method according to claim 1, wherein the second dies are electrically connected to the RDL through wire bonding.

18. The method according to claim 1, wherein the first die is electrically connected to the RDL through flip-chip bonding.

19. The method according to claim 1, wherein the conductive terminals are formed around the periphery of the first die.

20. The method according to claim 1, wherein the passive components are disposed on the periphery of the second dies.

* * * * *